US006686780B2

(12) United States Patent
Kimura et al.

(10) Patent No.: US 6,686,780 B2
(45) Date of Patent: Feb. 3, 2004

(54) FREQUENCY DIVIDER WITH SELECTABLE DIVISION FACTOR

(75) Inventors: Kenji Kimura, Tokyo (JP); Hitoshi Kurosawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/140,886

(22) Filed: May 9, 2002

(65) Prior Publication Data

US 2003/0090303 A1 May 15, 2003

(30) Foreign Application Priority Data

Nov. 13, 2001 (JP) ........................................ 2001-347901

(51) Int. Cl.⁷ .............................................. H03K 21/00
(52) U.S. Cl. ........................... 327/115; 327/117; 377/48
(58) Field of Search ......................... 327/115, 105–107, 327/113, 114, 117, 118, 141, 150, 154, 155, 159–162, 164–166; 377/47, 48

(56) References Cited

U.S. PATENT DOCUMENTS

| | | | | |
|---|---|---|---|---|
| 3,906,374 A | * | 9/1975 | Fletcher et al. | 377/111 |
| 4,267,512 A | * | 5/1981 | Rustenburg | 377/110 |
| 4,399,549 A | * | 8/1983 | Srivastava | 377/108 |
| 4,406,014 A | * | 9/1983 | Doron | 377/107 |
| 4,573,176 A | * | 2/1986 | Yeager | 377/48 |
| 4,587,664 A | * | 5/1986 | Iida | 377/48 |
| 5,128,673 A | * | 7/1992 | Tamamura et al. | 341/100 |
| 5,349,622 A | * | 9/1994 | Gorisse | 377/52 |
| 5,390,223 A | * | 2/1995 | Lindholm | 377/49 |
| 5,426,682 A | * | 6/1995 | Takatsu | 377/80 |
| 5,438,600 A | * | 8/1995 | Seki et al. | 377/47 |
| 5,524,037 A | * | 6/1996 | Doing et al. | 377/108 |
| 5,552,732 A | * | 9/1996 | Huang | 327/116 |
| 5,699,003 A | | 12/1997 | Saeki | |
| 5,955,907 A | * | 9/1999 | Niijima | 327/262 |
| 5,969,548 A | * | 10/1999 | Knapp | 327/117 |
| 6,041,093 A | * | 3/2000 | Cho | 377/47 |
| 6,163,181 A | * | 12/2000 | Nishiyama | 327/115 |
| 6,313,673 B1 | * | 11/2001 | Watanabe | 327/115 |

FOREIGN PATENT DOCUMENTS

| | | |
|---|---|---|
| JP | 7-321642 | 12/1995 |
| TW | 288232 | 10/1996 |

* cited by examiner

*Primary Examiner*—Timothy P. Callahan
*Assistant Examiner*—Hai L. Nguyen
(74) *Attorney, Agent, or Firm*—Leydig, Voit & Mayer, Ltd.

(57) ABSTRACT

A frequency divider includes a clock inversion circuit, an inverter, a delay processing circuit and serially connected data storage units. The clock inversion circuit receives an output of the final data storage unit and a clock signal of original oscillation, logically inverts the clock signal at a change of the output of the final data storage unit, and outputs the inverted clock signal to odd-numbered data storage units and even-numbered data storage units in a complementary manner as an input control signal. The inverter and delay processing circuit logically invert the output of the final data storage unit, provide the output of the final data storage unit with a predetermined delay, and input the delayed output to the data input of the first data storage unit.

8 Claims, 15 Drawing Sheets

US 6,686,780 B2

FREQUENCY DIVIDER WITH SELECTABLE DIVISION FACTOR

FIELD OF THE INVENTION

The present invention relates to a frequency divider having a division factor of an odd number applied to semiconductor integrated circuits such as microcomputers.

BACKGROUND OF THE INVENTION

In semiconductor integrated circuits such as microcomputers, a given clock is subjected to frequency multiplication in a PLL or the like or frequency division in a frequency divider to generate a desired clock signal. In these frequency dividers, an output having a duty of 50% obtained by frequency division with a division factor of an odd number is demanded in many cases.

In a conventional art, a complicated circuit that encodes a counter output and conducts necessary frequency division is used in order to implement a frequency divider having a division factor of an odd number and a duty different from 50% or, a frequency divider having a division factor of an odd number and a duty of 50%. Thus, there is a problem that the circuit scale is large and high speed operation is difficult.

FIG. 23 shows a configuration of a conventional frequency divider having a division factor of an odd number. In this conventional art, a division generation section 102 having a division factor of an odd number encodes outputs of 2N-counters 100 and 101 and conducts reset control on the 2N-counters 100 and 101 to produce a frequency division output with a division factor of N and a duty of 50%. In this conventional art, however, a logic circuit which encodes and resets counter is needed. Therefore, the circuit scale becomes large, and restrictions to the clock capable of being subject to frequency division become stricter.

In an N-stage Johnson counter formed of 2N flip-flops ($F_1$ to $F_{2N}$) explained in Japanese Patent Application Laid-Open No. 7-321642, a data output Q of a flip-flop at each stage except a final stage is input to a data input D of a flip-flop at its subsequent stage. In addition, an inverted data output QB of a flip-flop ($F_{2N}$) at the final stage is connected to a data input D of a flip-flop ($F_1$) at a first stage. A normal signal of a master clock $C_{IN}$ having a duty of 50% is input to clock inputs C of flip-flops at odd-numbered stages. An inverted signal of the master clock $C_{IN}$ is input to clock inputs C of flip-flops at even-numbered stages. Flip-flops of two stages form a Johnson counter of one stage. A first AND gate performs an AND-ing function on a data output Q of the flip-flop ($F_N$) at an Nth stage and a data output Q of the flip-flop ($F_{2N}$) at a 2Nth stage. A second AND gate performs an AND-ing function on an inverted data output QB of the flip-flop ($F_N$) at the Nth stage and an inverted data output QB of the flip-flop ($F_{2N}$) at the 2Nth stage. An OR gate performs an OR-ing function on outputs of the first AND gate and the second AND gate. A frequency division output with a division factor of N and a duty of 50% is obtained from an output of the OR gate. For example, if 2N=6, a frequency division output with a division factor of 3 can be obtained.

When frequency division with a division factor of 3 is conducted, the conventional art needs Johnson counters of three stages, i.e., flip-flop circuits of six stages. The number of stages of flip-flops increases, and the circuit scale becomes large. This results in a problem that it is difficult to cope with high speed operation.

SUMMARY OF THE INVENTION

It is an object of the present invention to provide a frequency divider capable of providing a frequency division signal having an arbitrary frequency division factor that includes a division factor of an odd number at a small circuit scale, and capable of operating at a high speed.

The frequency divider according to this invention comprises a storage having a plurality of serially-connected storage units which temporarily hold data input based on a control by an input control signal, in which a data output of each storage unit is input to an immediately subsequent storage unit. This frequency divider also comprises a clock inversion circuit which is supplied with an output of a final storage unit in the storage and a clock signal of original oscillation, inverts logic of the clock signal at timing of a change of the output of the final storage unit, and supplies the logic inverted clock signal to odd-numbered storage units and even-numbered storage units in a complementary manner as an input control signal. This frequency divider further comprises an inversion-delay circuit which inverts logic of the output of the final storage unit, provides the output of the final storage unit with a predetermined delay, and inputs the delayed output to a data input of a first storage unit in the storage.

Other objects and features of this invention will become understood from the following description with reference to the accompanying drawings.

Other objects and features of this invention will become apparent from the following description with reference to the accompanying drawings.

DETAILED DESCRIPTION

Embodiments of the frequency divider according to this invention will hereafter be explained in detail by referring to the accompanying drawings.

Figure 1:
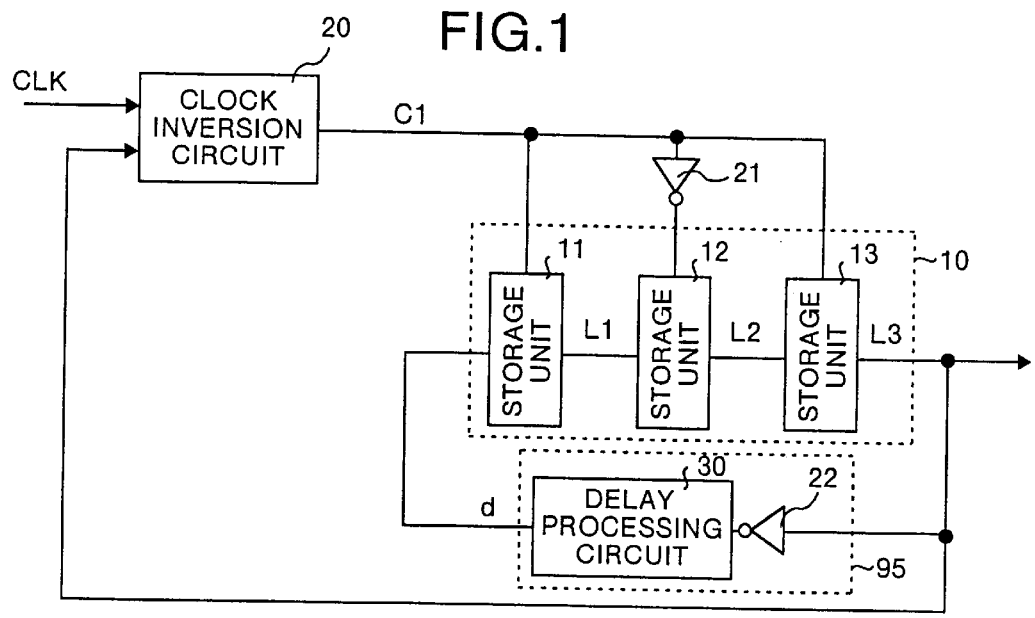
FIG. 1 is a block diagram which shows a conceptual configuration of a first embodiment of the frequency divider according to this invention.

FIG. 1 shows a first embodiment of the frequency divider according to this invention. The frequency divider shown in this figure outputs a signal obtained by conducting frequency division with a division factor of 3 (frequency division with a minimum odd number) on a clock signal CLK, from its output L3.

This frequency divider has a storage 10 having three serially-connected storage units 11 to 13. These storage units 11 to 13 temporarily hold data input based on a control by an input control signal C1. The storage 10 has a configuration in which data output from one storage unit is input into a subsequent storage unit. Each of the storage units 11 to 13 is a latch circuit of level trigger type.

A normal signal of the input control signal C1 output from a clock inversion circuit 20 is input to the latch 11 at the first stage as an input control signal. A signal obtained by logical-inverting the input control signal C1 output from the clock inversion circuit 20 with an inverter 21 is input to the latch 12 at the second stage. The normal signal of the input control signal C1 output from the clock inversion circuit 20 is input to the latch 13 at the third stage (final stage). In this way, the input control signal C1 output from the clock inversion circuit 20 is supplied to the latches 11 and 13 at odd-numbered stages and the latch 12 at an even-numbered stage in a complementary manner.

An output L3 of the latch 13 at the final stage is inverted in logic by an inverter 22, provided with a predetermined delay by a delay processing circuit 30, and fed back to a data input terminal of the latch 11 at the first stage. An inversion-delay circuit 95 is comprised of the inverter 22 and the delay processing circuit 30 as shown in FIG. 1.

The clock inversion circuit 20 is supplied with the clock signal CLK of the original oscillation and the output L3 of the latch 13 at the final stage. The clock inversion circuit 20 functions to invert the clock signal CLK at timing of a change in the output L3 of the latch 13 at the final stage. The clock inversion circuit 20 is formed of, for example, an exclusive-OR gate.

In this configuration, the inverted value of the output L3 of the third stage latch 13 is delayed by the delay processing circuit 30 and fed back to the latch 11 at the first stage. As a result, the feedback input d is delayed in time as compared with the inversion operation of the clock signal CLK (the input control signal C1) conducted in the clock inversion circuit 20 by using the output L3 of the latch 13 at the third stage.

Operation of the frequency divider of FIG. 1 will now be explained by referring to a time chart shown in FIG. 2. In this figure, legends (a) to (f) show the clock signal CLK, output L1 of the latch 11 at the first stage, output L2 of the latch 12 at the second stage, output L3 of the latch 13 at the third stage, output C1 of the clock inversion circuit, and the output (feedback input) d of the delay processing circuit 30, respectively.

It is now assumed that all of the latches 11 to 13 are in the reset state (output 0). Between time t1 and time t2, the input control signal C1 is kept at 1 and consequently the latches 11 and 13 become open. Therefore, the latch 11 latches the output d of the delay processing circuit 30, and the latch 13 latches the output L2 of the latch 12. As a result, the output L1 of the latch 11 rises to 1 at the time t1.

Between the time t2 and time t3, the input control signal C1 is kept at 0. Therefore, the latch 12 becomes open, and the latches 11 and 13 become closed. Therefore, the latch 12 latches the output L1 of the latch 11. As a result, the output L2 of the latch 12 rises to 1 at the time t2.

Between the time t3 and time t4, the input control signal C1 is kept at 1. Therefore, the latches 11 and 13 become open, and the latch 12 becomes closed. Therefore, the latch 11 latches the output d of the delay processing circuit 30, and the latch 13 latches the output L2 of the latch 12. As a result, the output L3 of the latch 13 rises to 1 at the time t3. In addition, the clock signal CLK is inverted by a change of the output L3 of the latch 13, and the input control signal C1 falls at the time t4. In other words, an interval Ta shown in FIG. 2 is a time required from the output change of the latch 13 until the inversion of the clock signal CLK is reflected into the input control signal C1.

Figure 2:
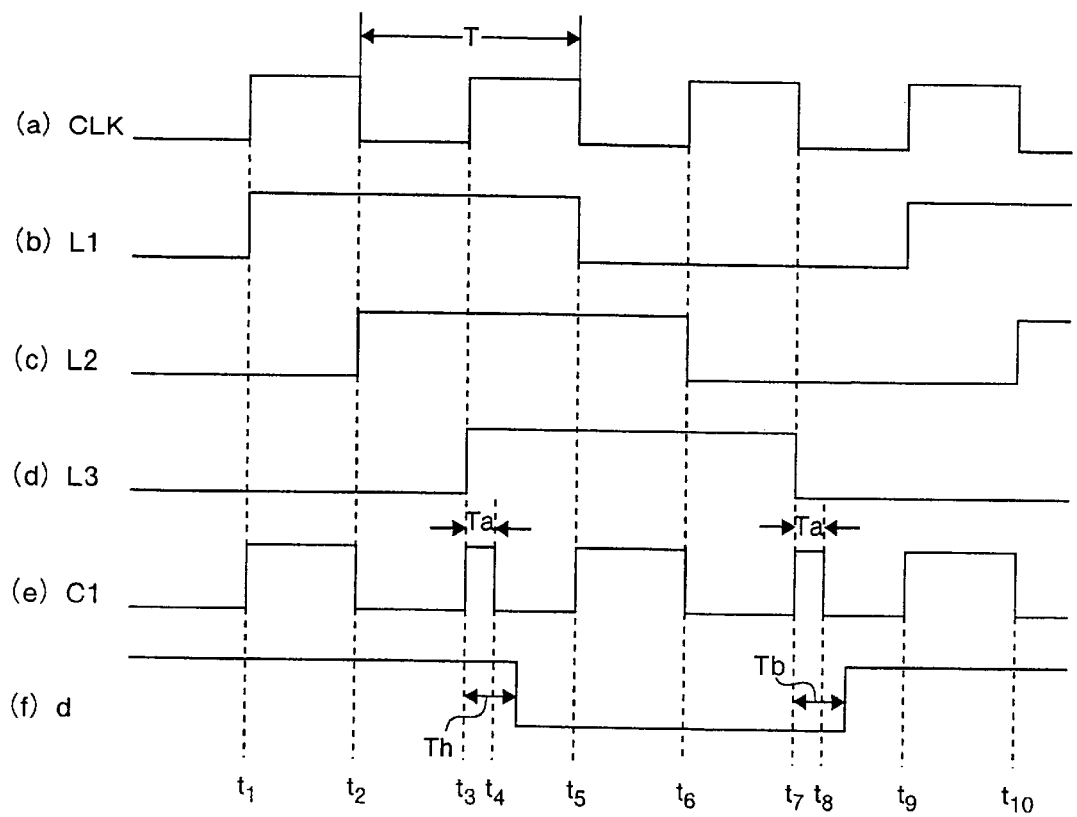
FIG. 2 is a time chart which shows an operation of the first embodiment.

On the other hand, time Tb shown in FIG. 2 is time required from a change of the output L3 of the latch 13 until the feedback input d is changed. The time Tb corresponds to the delay value set by the delay processing circuit 30. Denoting one period of the clock signal CLK by T, the delay value of the delay processing circuit 30 is set so as to satisfy the relation Ta<Tb<T. In other words, in this case, the change of the feedback input d is adapted to occur later than the inversion operation of the input control signal C1 caused by the output L3 of the latch 13.

Between the time t4 and time t5, the input control signal C1 is kept at 0. Therefore, the latch 12 becomes open. On the other hand, the latches 11 and 13 become closed. Therefore, the latch 12 latches the output L1 of the latch 11. At this time, the output L2 of the latch 12 does not change.

Between the time t5 and time t6, the input control signal C1 is kept at 1. Therefore, the latches 11 and 13 become open, and the latch 12 becomes closed. Therefore, the latch 11 latches the output d of the delay processing circuit 30, and the latch 13 latches the output L2 of the latch 12. As a result, the output L1 of the latch 11 falls to 0 at the time t5.

Between the time t6 and time t7, the input control signal C1 is kept at 0. Therefore, the latch 12 becomes open. On the other hand, the latches 11 and 13 become closed. Therefore, the latch 12 latches the output L1 of the latch 11. As a result, the output L2 of the latch 12 falls to 0 at the time t6.

Between the time t7 and time t8, the input control signal C1 is kept at 1. Therefore, the latches 11 and 13 become open, and the latch 12 becomes closed. Therefore, the latch 11 latches the output d of the delay processing circuit 30, and the latch 13 latches the output L2 of the latch 12. As a result, the output L3 of the latch 13 falls to 0 at the time t7. In addition, the clock signal CLK is inverted by a change of the output L3 of the latch 13, and the input control signal C1 falls to 0 at the time t8.

Between the time t8 and time t9, the input control signal C1 is kept at 0. Therefore, the latch 12 becomes open. On the other hand, the latches 11 and 13 become closed. At this time, the output L2 of the latch 12 does not change.

Between the time t9 and time t10, the input control signal C1 is kept at 1. Therefore, the latches 11 and 13 become open, and the latch 12 becomes closed. Therefore, the latch 11 latches the output d of the delay processing circuit 30, and the latch 13 latches the output L2 of the latch 12. As a result, the output L1 of the latch 11 rises to 1 at the time t9. Thereafter, the same operation is repeated.

Thus, in the first embodiment, the clock signal CLK is intentionally inverted by the output L3 of the latch 13 at the final stage. Thereby, the input control signal C1 increased in number to 3/2 times that of the clock signal CLK is formed. The latch operations of the latches 11 to 13 are caused by the input control signal C1. In addition, the output L3 of the latch 13 at the final stage is provided with the delay by the delay processing circuit 30. The feedback input d, which satisfies the relation Ta<Tb, is input to the latch 11 at the first stage. Therefore, the frequency divider with the division factor of 3, which conducts frequency division with the division factor of 3 on the clock signal CLK, can be implemented by the three-stage latches. Therefore, the scale of the frequency divider can be made small, and coping with fast operation is also facilitated.

If the number N of storage units in the storage 10 is even, frequency division with a division factor of N−1, i.e., an odd number is conducted. For example, if the number N of storage units is two (N=2), since the division factor is 1, that means the frequency division is not conducted.

Figure 3A:
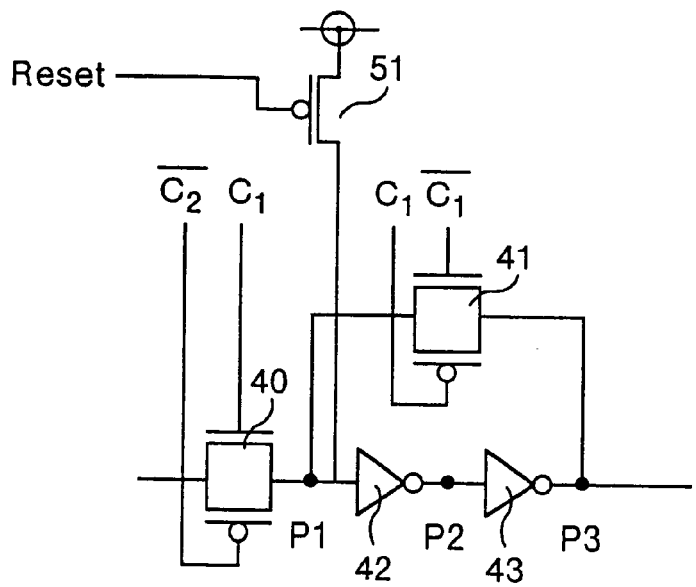
FIG. 3A, FIG. 3B, and FIG. 3C show various kinds of concrete circuit configurations of a storage unit.
Figure 3B:
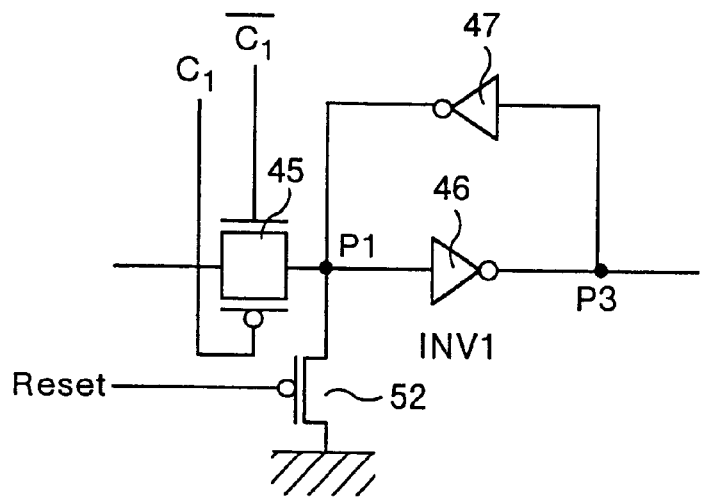

The latches of level trigger type used as the storage units 11 to 13 may be, for example, a positive latch as shown in FIG. 3A or a half latch as shown in FIG. 3B.

The positive latch shown in FIG. 3A uses two CMOS transmission gates 40 and 41, which conduct reciprocal switching operations, and two inverters 42 and 43. Two complementary input control signals C1 and /C1 are input to the transmission gates 40 and 41. The half latch shown in FIG. 3B uses one CMOS transmission gate 45 and two inverters 46 and 47. In the case of FIG. 3A and FIG. 3B, a CMOS transmission gate is used for an input from a preceding stage. Instead of this, however, a clocked gate may also be used. As the storage units 11 or 13, an arbitrary circuit configuration may be adopted so long as it is a temporary storage circuit capable of holding data while the input control signal C1 is either "H" or "L." When a plurality of input control signals are used as in a thirteenth embodiment explained later, an arbitrary circuit configuration may be adopted so long as it is a temporary storage circuit that holds data for a specific interval so that an odd-numbered stage and an even-numbered stage will not latch data simultaneously.

Figure 3C:
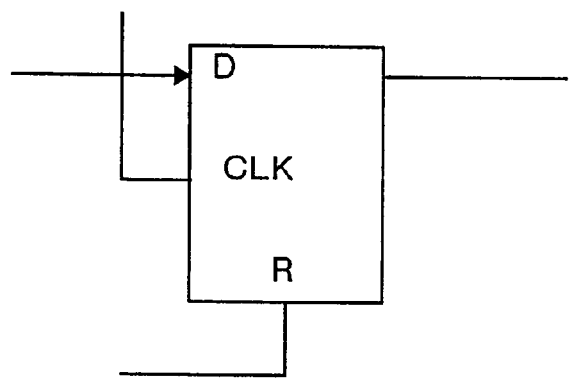

When latches of edge trigger type are used as the storage units 11 to 13, D flip-flops as shown in FIG. 3C can be used. In such a circuit, there is no need to delay the feedback input d with respect to the clock inversion.

Figure 4A:
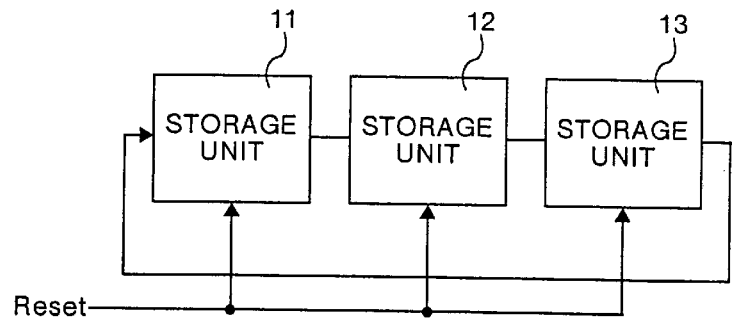
FIG. 4A and FIG. 4B are diagrams for explaining a reset technique of a storage unit.
Figure 4B:
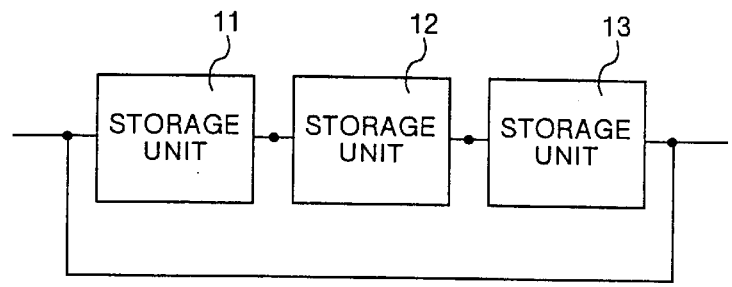

FIGS. 4A and 4B are diagrams showing a reset technique at the time of starting the frequency divider. In FIG. 4A, a reset signal Reset is input simultaneously to the storage units 11 to 13, and thereby all storage units 11 to 13 are simultaneously reset.

In FIG. 4B, a reset signal Reset or data 0 is supplied to any one of the storage units 11 to 13 to reset the storage unit. Thereafter, the clock signal CLK is input to the storage units 11 to 13 for a predetermined interval. The reset state of one storage unit is thus shifted to other stages to reset all storage units 11 to 13. If the data 0 is supplied first, the circuit configuration used for resetting can be omitted.

Figure 5:
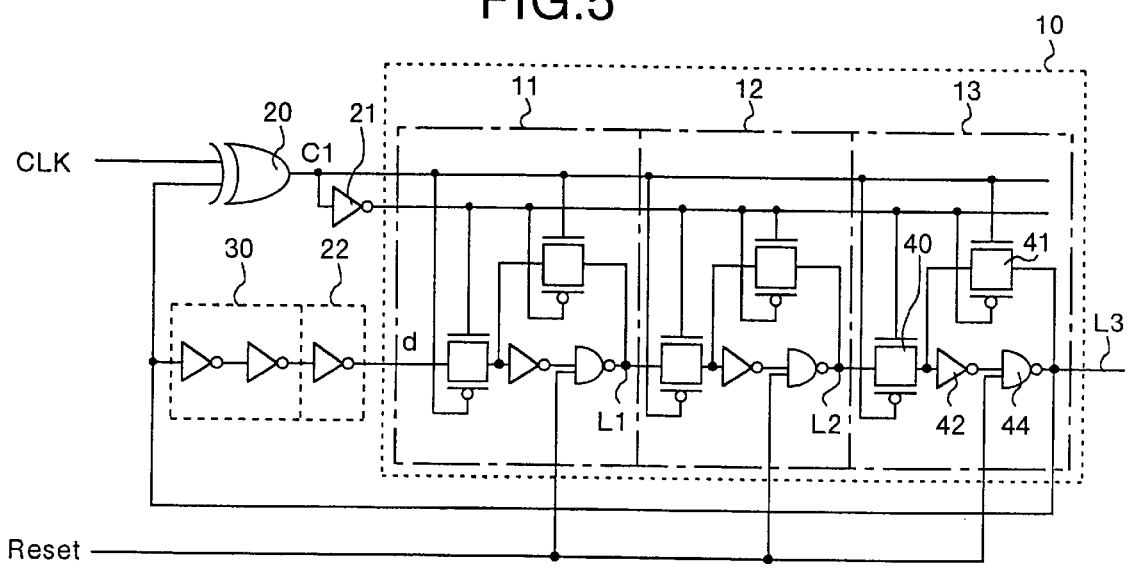
FIG. 5 is a circuit diagram which shows a configuration of a second embodiment of the frequency divider according to this invention.

A second embodiment of the present invention will now be explained by referring to FIG. 5. FIG. 5 shows concrete representations of components of FIG. 1. A positive latch including the two CMOS transmission gates 40 and 41, inverter 42, and NAND gate 44 is adopted as each of the storage units 11 to 13 in the storage 10. An exclusive-OR gate is adopted as the clock inversion circuit 20. Two inverters are adopted as the delay processing circuit 30. In this case, the reset signal Reset is input to the NAND gates 44 of the respective storage units to conduct simultaneous resetting.

In the second embodiment as well, values of the storage units are shifted by one stage every half period of the clock signal CLK. Since an output of the third stage is inverted and fed back to the first stage 11, the output of the third stage changes at the time of three half-periods. At this time, the input control signal C1 is inverted. However, the output change of the third stage is input to the first stage 11 later than inversion of the input control signal C1 by the delay processing circuit 30. At the time of three half-periods, therefore, the output change of the third stage is not shifted to the first stage. At this time, all the storage units 11 to 13 have values inverted with respect to the initial values. This is repeated every three half-periods. As a result, an output value resulting from frequency division with a division factor of 3 conducting on the clock signal CLK is obtained from the output unit 13 at the third stage.

In the case of FIG. 5, the NAND gate 44 is inserted in each of the storage units 11 to 13, and the storage units are simultaneously reset by the reset signal Reset. However, the NAND gate may be replaced with a logic element such as a NOR gate. If the storage units 11 to 13 are formed of positive latches, some of P1 to P3 may be pulled up via a P-channel transistor 51 as shown in FIG. 3A, or pulled down via an N-channel transistor. If each of the storage units 11 to 13 is a half latch, either P1 or P3 may be pulled down via an N-channel transistor 52 as shown in FIG. 3B, or pulled up via a P-channel transistor. The storage units 11 to 13 maybe reset simultaneously by implementing the transmission gate as a clocked gate, i.e., implementing the NAND circuits, NOR circuits and the transmission gate as a composite gate.

Figure 6:
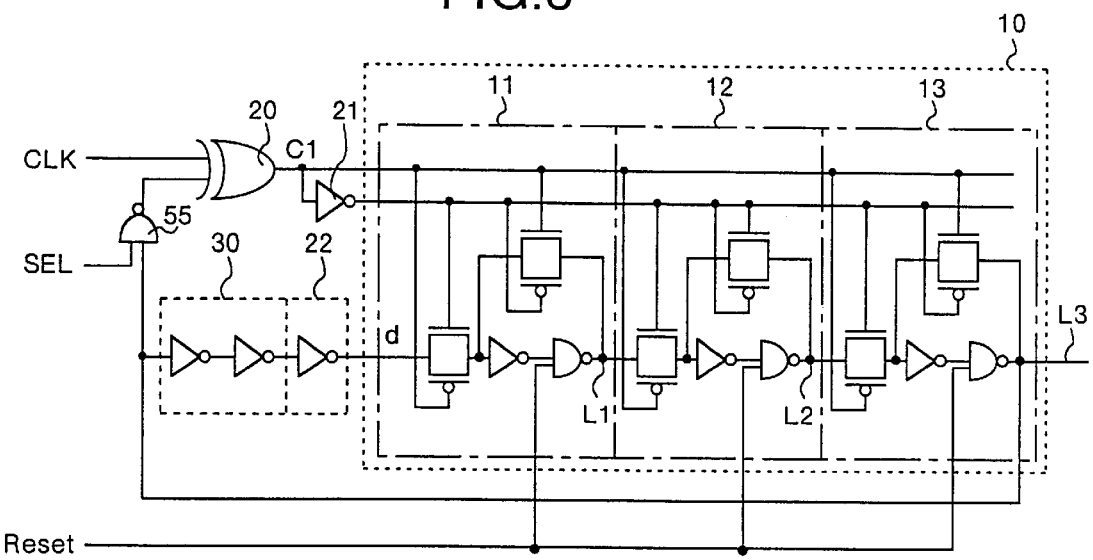
FIG. 6 is a circuit diagram which shows a configuration of a third embodiment of the frequency divider according to this invention.

A third embodiment of the present invention will now be explained by referring to FIGS. 6 and 7. In the third embodiment, a gate circuit 55 is added to the configuration of the second embodiment explained above. The gate circuit 55 conducts switching as to whether the output L3 of the final storage unit 13 in the storage 10 is input to the clock inversion circuit 20. By this switching, either frequency division with a division factor of an even number (2 in this case) or frequency division with a division factor of an odd number (3 in this case) can be selected. The output L3 of the final storage unit 13 and a selection signal SEL are input to the gate circuit 55 (NAND circuit in this case) Switching is conducted by the selection signal SEL as to whether the output L3 of the final storage unit 13 is selected.

When the output L3 of the final storage unit 13 is passed through the gate circuit 55 and input to the clock inversion circuit 20 by the selection signal SEL, the same operation as that of the time chart shown in FIG. 2 is conducted, and a signal resulting from frequency division with a division factor of 3 conducted on the clock signal CLK is obtained from the output L3 of the final storage unit 13.

Figure 7:
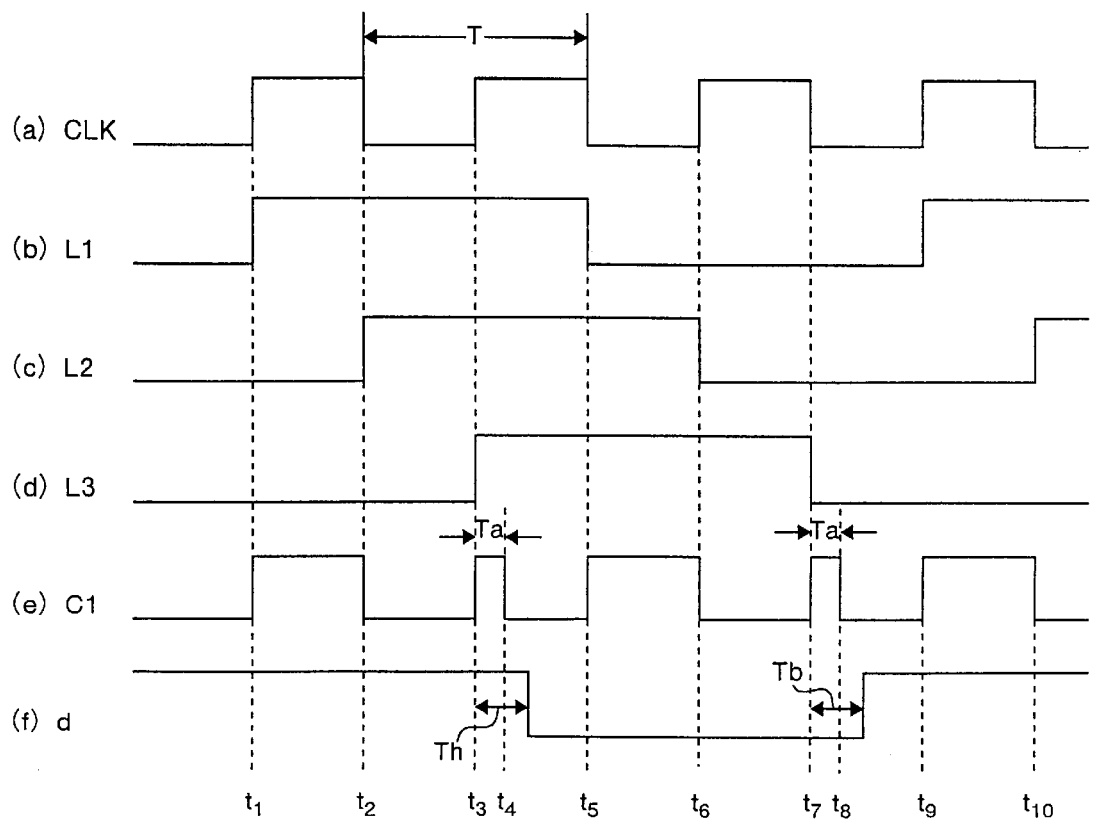
FIG. 7 is a time chart which explains an operation of the third embodiment.

A time chart is shown in FIG. 7, in which the output L3 of the final storage unit 13 is determined not to be passed by the selection signal SEL. In this case, the output L3 of the final storage unit 13 is not input to the clock inversion circuit 20. Therefore, the input control signal C1 output from the clock inversion circuit 20 becomes the same waveform as that of the clock signal CLK. And in this case, a change of the output L3 of the final storage unit 13 is shifted into the first storage unit 11 when the clock signal is 1. As shown in (d) of FIG. 7, therefore, a signal resulting from frequency division with a division factor of 2 conducted on the clock signal is obtained from the output L3 of the final storage unit 13.

Thus, in the third embodiment, switching between the frequency division operation with a division factor of 2 and the frequency division operation with a division factor of 3 can be conducted by switching as to whether the output L3 of the final storage unit 13 is input to the clock inversion circuit 20.

Figure 8:
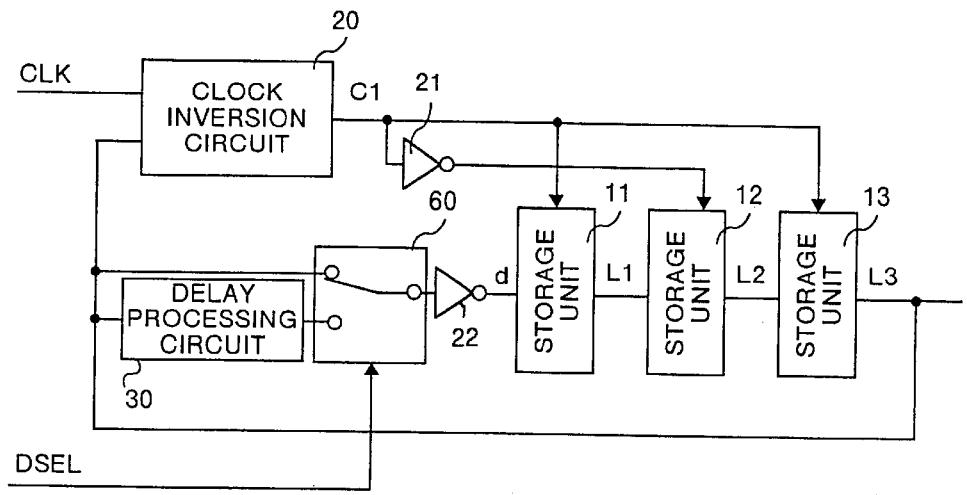
FIG. 8 is a block diagram which shows a conceptual configuration of a fourth embodiment of the frequency divider according to this invention.
Figure 9:
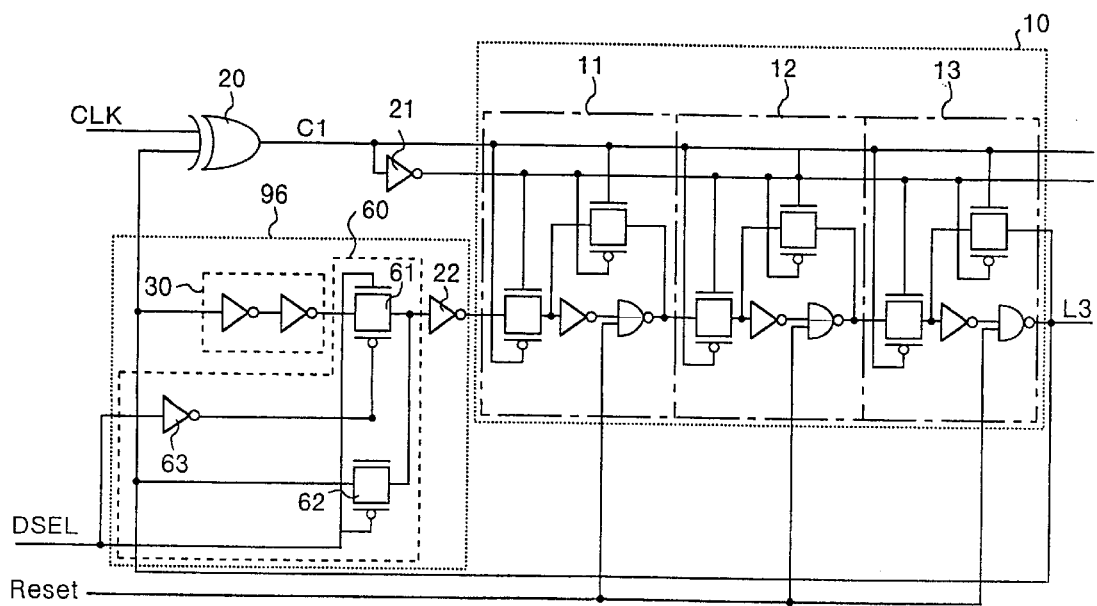
FIG. 9 is a circuit diagram which shows a concrete configuration of the fourth embodiment.

A fourth embodiment of the present invention will now be explained by referring to FIGS. 8 to 10. FIG. 8 is a block diagram showing a conceptual configuration of the fourth embodiment. FIG. 9 is a circuit diagram showing its concrete configuration.

In the fourth embodiment, a delay selection circuit 60 is added to the configuration of the first or second embodiments explained above. The delay selection circuit 60 conducts switching as to whether the output L3 of the final storage unit 13 delayed by the delay processing circuit 30 is input to the first storage unit 11. By this switching, either frequency division with a division factor of 3 or no frequency division (frequency division with a division factor of 1) can be selected. As shown in FIG. 8, the delay selection circuit 60 is added to the configuration of the first embodiment. As shown in FIG. 9, the delay selection circuit 60 formed of two transmission gates 61 and 62 and an inverter 63 is added to the configuration of the second embodiment. An inversion-delay circuit 96 is comprised of the delay processing circuit 30, the delay selection circuit 60, and the inverter 22.

The output L3 of the final storage unit 13 and an output of the delay processing circuit 30, which provides the output L3 of the final storage unit 13 with a predetermined delay, are input to the delay selection circuit 60. The delay selection circuit 60 selects one of these two inputs according to a delay selection signal DSEL, which is input thereto, and outputs the selected input to the inverter 22.

When the output of the delay processing circuit 30 is selected according to the delay selection signal DSEL, the same operation as that of the time chart shown in FIG. 2 is conducted, and a signal resulting from frequency division with a division factor of 3 conducted on the clock signal CLK is obtained from the output L3 of the final storage unit 13.

Figure 10:
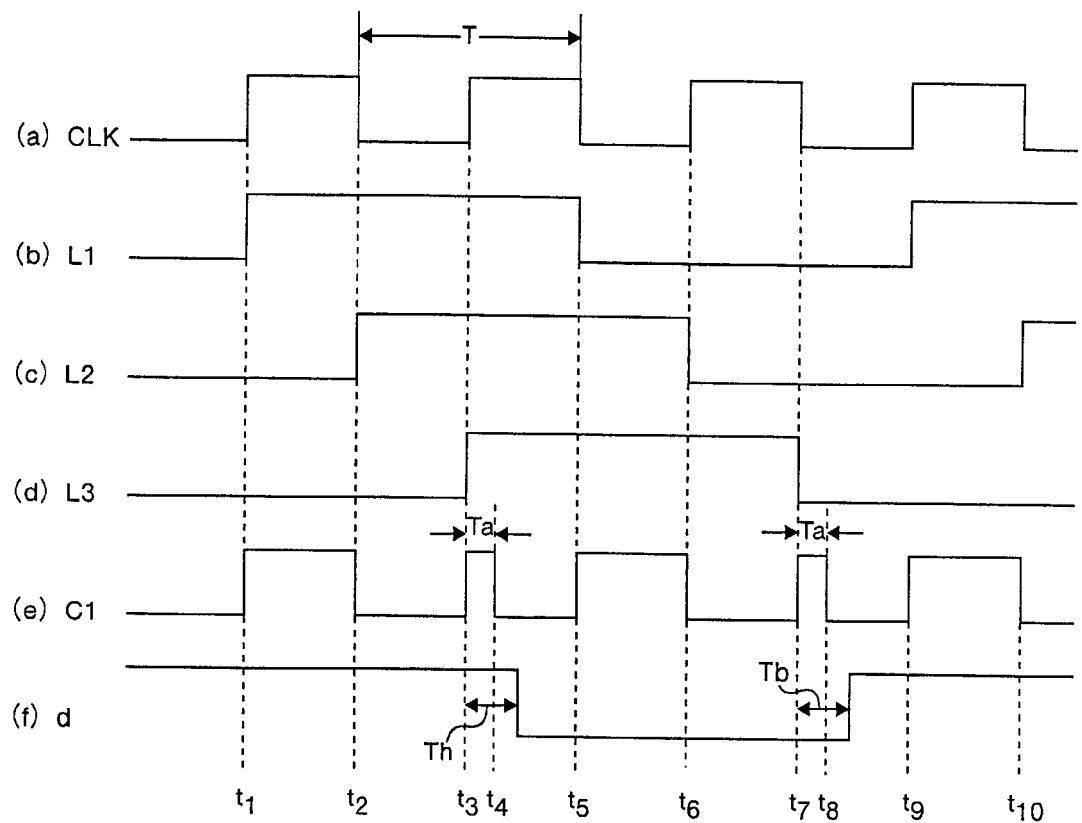
FIG. 10 is a time chart which shows an operation of the fourth embodiment.

A time chart is shown in FIG. 10, in which the output L3 of the final storage unit 13 is input to the inverter 22 without being delayed according to the delay selection signal DSEL. In this case, since Ta>Tb, the change of the output L3 of the final storage unit 13 becomes earlier than the inversion of the input control signal C1. Since the first storage unit 11 and the final storage unit 13 are identical in open/close state, the signal change of the output L3 of the final storage unit 13 is stored in the first storage unit 11. In addition, the output L1 of the first storage unit 11 is shifted into the second storage unit 12 based on a control of subsequently inverted input control signal C1. Therefore, operation of no frequency division takes place. A signal resulting from frequency division with a division factor of 1 (=N−2) conducted on the clock signal CLK is obtained from the output L3 of the final storage unit 13.

Thus, in the fourth embodiment, switching between the operation of no frequency division and the frequency division operation with a division factor of 3 can be conducted by switching as to whether delay is provided.

By combining the configuration of the fourth embodiment with the configuration of the third embodiment, a frequency divider having a division factor of 1, a frequency divider having a division factor of 2, and a frequency divider having a division factor of 3 are implemented by using small-scale circuits.

Figure 11:
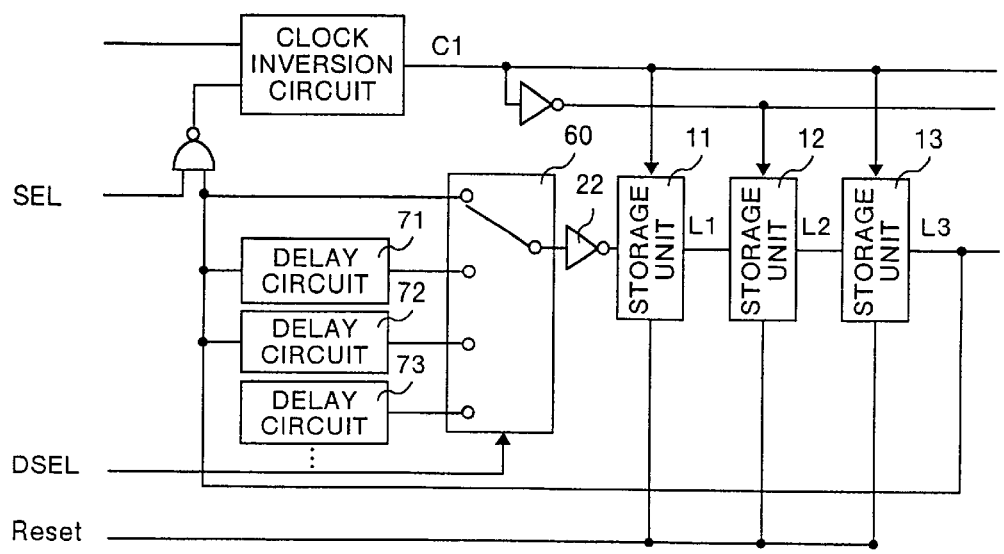
FIG. 11 is a block diagram which shows a conceptual configuration of a fifth embodiment of the frequency divider according to this invention.

A fifth embodiment of the present invention will now be explained by referring to FIG. 11. In the fifth embodiment, delay circuits 71, 72, 73, . . . , which give a plurality of different delays, are provided. By conducting selection on the delay circuits 71, 72, 73, . . . , and no delay by means of the delay selection circuit 60, different arbitrary division factors of odd numbers are obtained. Further, in the fifth embodiment, the gate circuit 55, which conducts switching as to whether the output L3 of the final storage unit 13 in the storage 10 is input to the clock inversion circuit 20, is provided in the same way as the third embodiment. By conducting switchover of the gate circuit 55, therefore, different arbitrary frequency division factors of even numbers can be obtained.

For example, it is now assumed that delays of the delay circuits 71, 72 and 73 are Tb (>Ta), T+Tb, and 2T+Tb, respectively.

It is now assumed that clock inversion is selected by a selection signal SEL. When no delay is selected by a delay selection signal DSEL, an output resulting from frequency division with a division factor of 1 is obtained. When the delay circuit 71 is selected by the delay selection signal DSEL, an output resulting from frequency division with a division factor of 3 is obtained. When the delay circuit 72 is selected by the delay selection signal DSEL, an output resulting from frequency division with a division factor of 5 is obtained. When the delay circuit 73 is selected by the delay selection signal DSEL, an output resulting from frequency division with a division factor of 7 is obtained.

It is now assumed that clock non-inversion is selected by a selection signal SEL. When the delay circuit 71 is selected by the delay selection signal DSEL, an output resulting from frequency division with a division factor of 2 is obtained. When the delay circuit 72 is selected by the delay selection signal DSEL, an output resulting from frequency division with a division factor of 4 is obtained. When the delay circuit 73 is selected by the delay selection signal DSEL, an output resulting from frequency division with a division factor of 6 is obtained.

Thus, in the fifth embodiment, a plurality of delay circuits having different delays are provided, and an arbitrary frequency division factor can be obtained by conducting selection from these delays.

Figure 12:
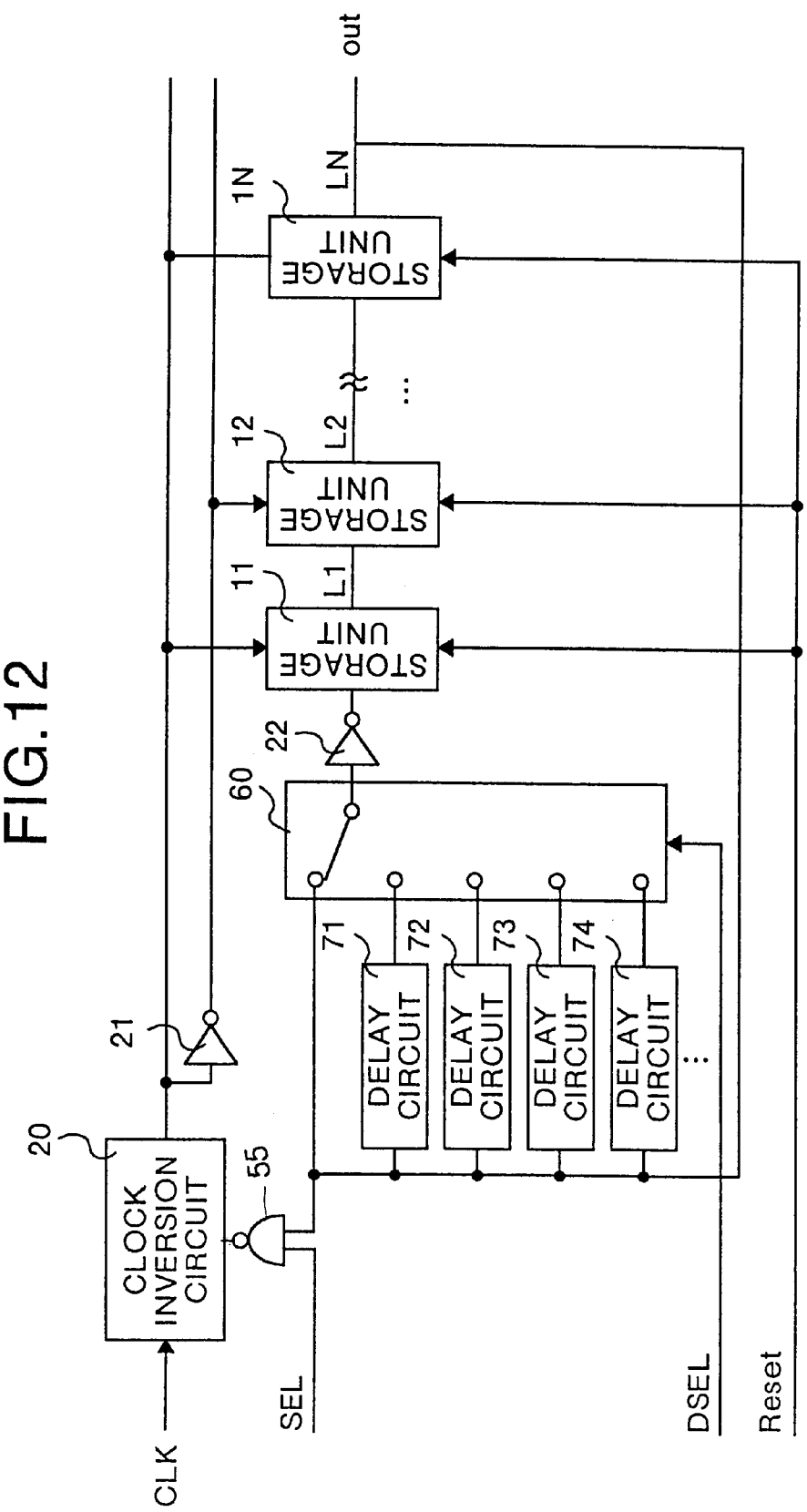
FIG. 12 is a block diagram which shows a conceptual configuration of a sixth embodiment of the frequency divider according to this invention.

A sixth embodiment of the present invention will now be explained by referring to FIG. 12. In the sixth embodiment, the number of units in the storage 10 is set equal to N which is at least 3. In addition, in the same way as the fifth embodiment, the delay circuits 71, 72, 73, 74, . . . delay selection circuit 60, and the gate circuit 55 are provided. Specifically, the delay circuits 71, 72, 73, 74, . . . give a plurality of different delays Tb+n·T, the delay selection circuit 60 conducts selection on the delay circuits 71, 72, 73, 74, . . . and no delay by means of a delay selection signal DSEL, and the gate circuit 55 conducts switching as to whether the output L3 of the final storage unit 13 in the storage 10 is input to the clock inversion circuit 20 by the selection signal SEL.

According to the sixth embodiment, therefore, frequency division operation with a division factor of N−2, N−1, N, or N+β (where β is an arbitrary integer) can be implemented by suitably giving the selection signal SEL and the delay selection signal DSEL. According to the sixth embodiment, frequency division with a division factor of N or N−1 is possible by arbitrarily setting the number N of units in the storage 10 if a plurality of delay circuits having different delays are not provided. As compared with the case in which the division factor is set only by setting delays as in the fifth embodiment, therefore, management of delays is facilitated and the structure is also simplified.

Figure 13:
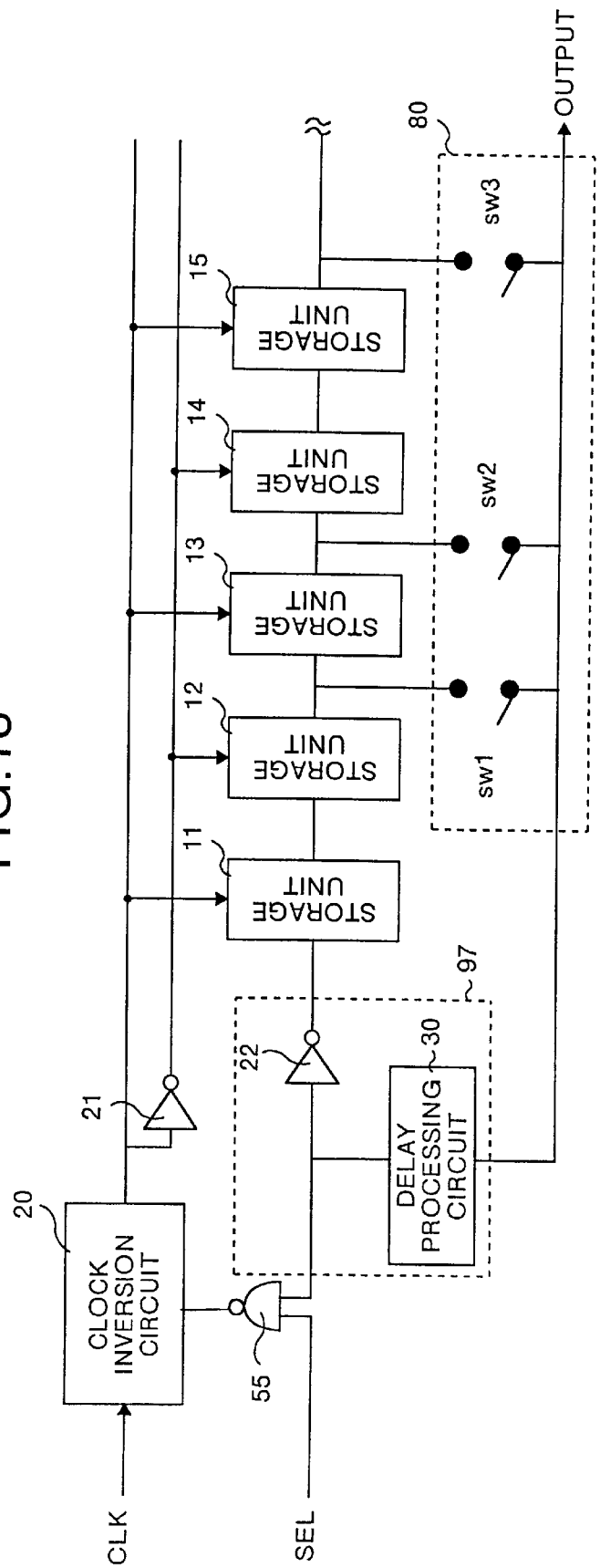
FIG. 13 is a block diagram which shows a conceptual configuration of a seventh embodiment of the frequency divider according to this invention.

A seventh embodiment of the present invention will now be explained by referring to FIG. 13. In the seventh embodiment, the number of units in the storage 10 is set equal to five, and a storage unit selection circuit 80 is provided. The storage unit selection circuit 80 selects one of outputs respectively of the five storage units 11 to 15 and inputs the selected output to an inversion-delay circuit 97. In this case, the storage unit selection circuit 80 includes switches SW1, SW2 and SW3. The switch SW1 selects the output of the second storage unit 12. The switch SW2 selects the output of the third storage unit 13. The switch SW3 selects the output of the fifth storage unit 15.

Further, the delay processing circuit 30 and the gate circuit 55 are provided. The delay processing circuit 30 provides a delay Tb. The gate circuit 55 conducts switching as to whether the output of the storage unit selected by the storage unit selection circuit 80 should be input to the clock inversion circuit 20.

It is now assumed that in the seventh embodiment the clock inversion is made valid by the selection signal SEL. When the switch SW1 is on and the switches SW2 and SW3 are off, a signal which is not subjected to frequency division is obtained as an output, as evident from explanation of foregoing embodiments. When the switch SW2 is on and the switches SW1 and SW3 are off, a signal resulting from frequency division with a division factor of 3 is obtained as the output. When the switch SW3 is on and the switches SW1 and SW2 are off, a signal resulting from frequency division with a division factor of 5 is obtained as the output.

It is now assumed that the clock inversion is made invalid by the selection signal SEL. When the switch SW2 is on and the switches SW1 and SW3 are off, a signal resulting from frequency division with a division factor of 2 is obtained as the output. When the switch SW3 is on and the switches SW1 and SW2 are off, a signal resulting from frequency division with a division factor of 4 is obtained as the output.

In other words, when a storage unit N for signal output is an even-numbered unit and clock inversion is not conducted, a signal resulting from frequency division with a division factor of N is obtained. When the storage unit N for signal output is an even-numbered unit and clock inversion is conducted, a signal resulting from frequency division with a division factor of N−1 is obtained. When the storage unit N for signal output is an odd-numbered unit and clock inversion is not conducted, a signal resulting from frequency division with a division factor of N−1 is obtained. When the storage unit N for signal output is an odd-numbered stage and clock inversion is conducted, a signal resulting from frequency division with a division factor of N is obtained.

Thus, in the seventh embodiment, an arbitrary frequency division factor can be obtained with such a simple circuit configuration that an output of a storage unit is selected.

Figure 14:
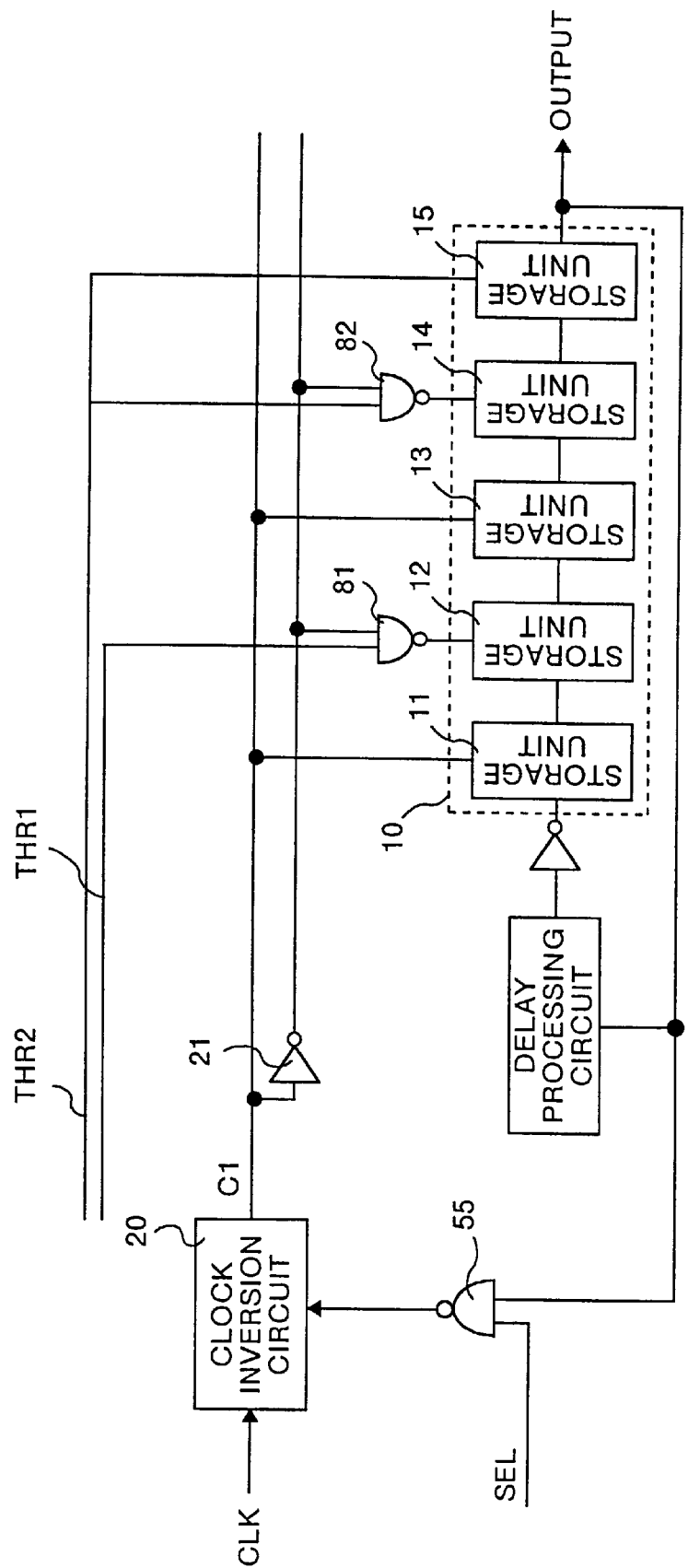
FIG. 14 is a block diagram which shows a conceptual configuration of an eighth embodiment when a level trigger type is used for storage units in the frequency divider according to this invention.
Figure 15:
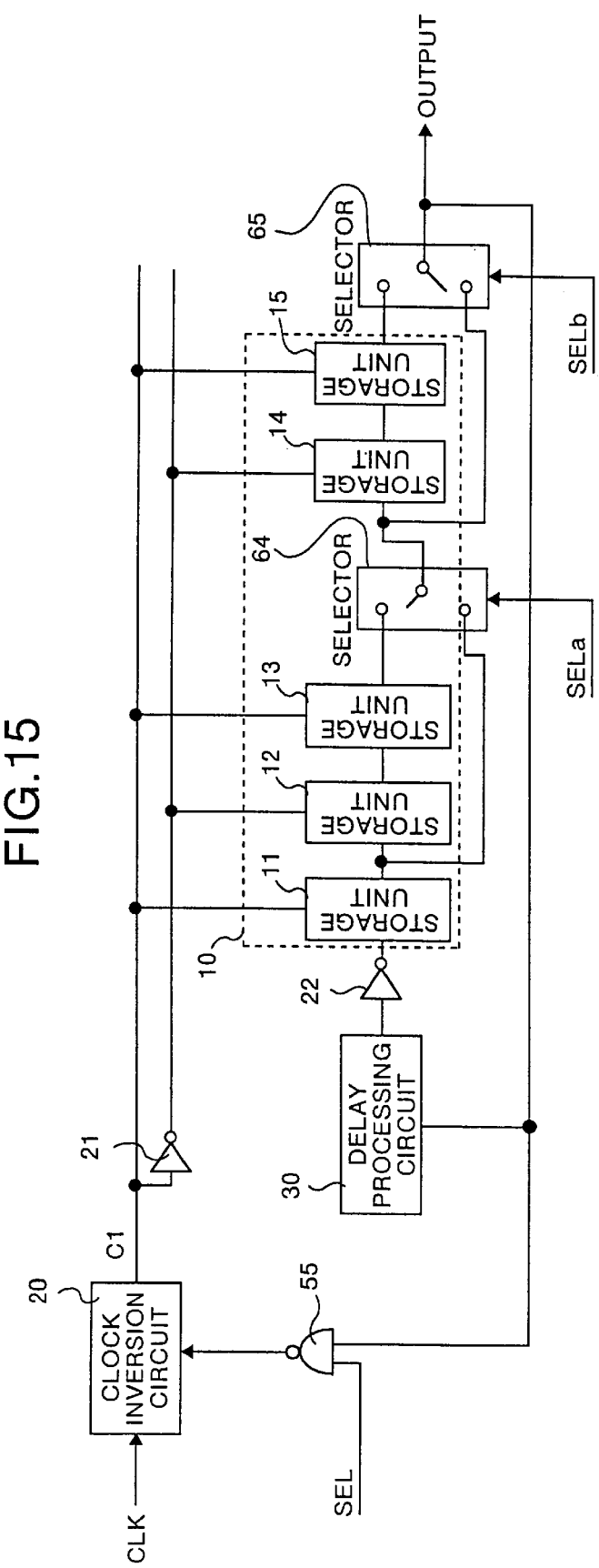
FIG. 15 is a block diagram which shows a conceptual configuration of the eighth embodiment when an edge trigger type is used in storage units in the frequency divider according to this invention.

An eighth embodiment of the present invention will now be explained by referring to FIGS. 14 and 15. The storage units 11 to 15 shown in FIG. 14 are of level trigger type. On the other hand, the storage units 11 to 15 shown in FIG. 15 are of edge trigger type.

As shown in FIG. 14, gate circuits 81 and 82 are further provided. The gate circuits 81 and 82 conduct switching as to whether some storage units (in this case, the second storage unit 12 and the fourth storage unit 14) included in a plurality of storage units 11 to 15 in the storage 10 are always in the data-through state. By switching the gate circuits 81 and 82, the frequency division factor can be changed (in this case, switching of the division factor between 3 and 5).

The gate circuit (in this case, a NAND circuit) 81 is supplied with a through signal THR1 and an inverted signal of the input control signal C1. The gate circuit 81 gives its output to the storage unit 12. The gate circuit 82 is supplied with a through signal THR2 and the inverted signal of the input control signal C1, and gives its output to the storage unit 14.

For example, when the storage units 11 to 15 are formed of positive latches, the substantial number of storage units is reduced to three by always opening transmission gates of the storage units 12 and 14 by means of the outputs of the gate circuits 81 and 82.

If the storage units 12 and 14 are always kept in the open state by the through signals THR1 and THR2, the number of storage units in the storage having five units becomes equivalent to three. As a result, a signal resulting from frequency division with a division factor of 3 can be obtained from the output of the storage having five units. When the storage units 12 and 14 are not in the open state, a signal resulting from frequency division with a division factor of 5 is obtained. By conducting switching as to whether inputs of the through signals THR1 and THR2 are supplied, it becomes possible to select either frequency division with a division factor of 3 or frequency division with a division factor of 5.

All storage units may be set so as to perform the data through operation. Since the input control signal C1 is supplied to even-numbered stages and odd-numbered stages in a complementary manner, however, alternate storage units need only be set.

FIG. 15 shows a circuit configuration of the case in which the storage units 11 to 15 are edge trigger type. When the edge trigger type is used, one or more selectors 64 and 65 which selects either a signal obtained by bypassing storage units or an output of an immediately preceding storage unit are provided on the middle of the storage units 11 to 15 in the storage 10. By controlling switching in the selectors 64 and 65, the frequency division factor can be altered. The selectors 64 and 65 are controlled in switching by selection signals SELa and SELb.

The selector 64 selects either the output of the storage unit 11 or the output of the storage unit 13, and outputs the selected output to the storage unit 14. The selector 65 selects either the output of the selector 64 or the output of the storage unit 15 and outputs the selected output.

If the selector 64 is connected to the bypass side, i.e., the storage unit 11 by the selection signal SELa and the selector 65 is connected to the storage unit 15 by the selection signal SELb, the storage units 13 and 14 are made through, and the number of storage units in the storage 10 becomes equivalent to three. As a result, a signal resulting from frequency division with a division factor of 3 can be obtained from the output of the storage 10. On the other hand, if the selector 64 is connected to the storage unit 13 and the selector 65 is connected to the storage unit 15, the number of storage units in the storage 10 becomes equivalent to five. As a result, a signal resulting from frequency division with a division factor of 3 can be obtained from the output of the storage 10. Thus, also when the storage units 11 to 15 are edge trigger type, switching between arbitrary frequency division factors, such as switching between a division factor of 3 and a division factor of 5, becomes possible by inserting selectors into the middle of the storage units.

Figure 16:
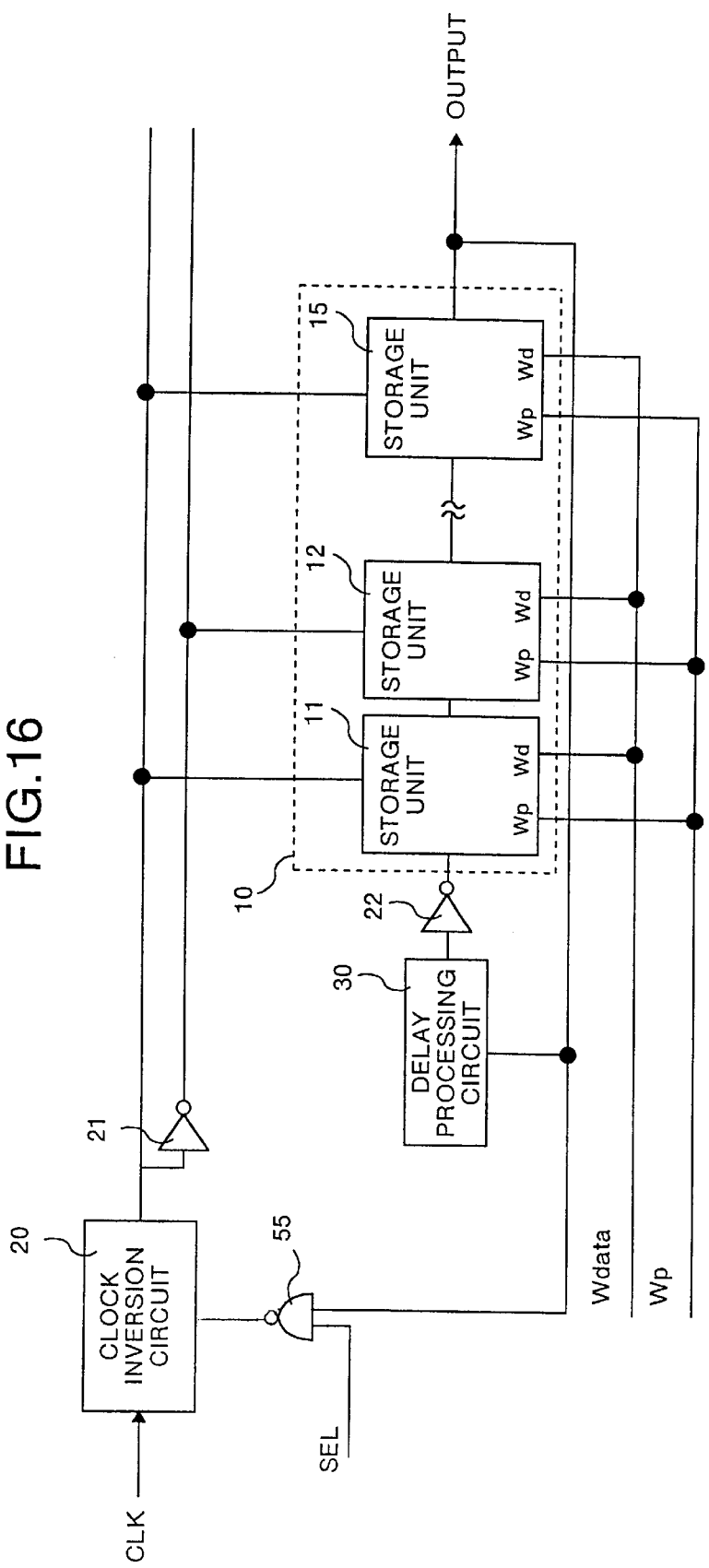
FIG. 16 is a block diagram which shows a conceptual configuration of a ninth embodiment of the frequency divider according to this invention.

A ninth embodiment of the present invention will now be explained by referring to FIG. 16. In the ninth embodiment, the storage units 11 to 15 of the storage 10 are not reset at the beginning, but storage units in which arbitrary initial data can be written are adopted. When setting initial data, arbitrary write data Wdata is input to the storage units 11 to 15 in such a state that a write control signal WP is on.

According to the ninth embodiment, the same 0 or 1 is not set as all initial data of the storage units 11 to 15, but different values can be set stage by stage. Accordingly, it becomes possible to alter the frequency division factor and the output waveform to some degree.

A tenth embodiment of the present invention will now be explained by referring to FIGS. 17 to 19. In the foregoing embodiments, different delays are obtained according to the number of connected logic elements such as inverters. In the tenth embodiment, however, delays are implemented by a digital delay circuit utilizing a counter or the like. The digital delay circuit can provide an output signal obtained by providing its input signal with a delay amount corresponding to a preset digital value.

As in the fifth embodiment, a frequency divider having an arbitrary division factor can be formed by selection of a different delay. In that case, however, it becomes complicated and difficult to control the delay when the frequency division factor has become large.

Therefore, the tenth embodiment is formed so that an arbitrary frequency division factor may be obtained simply by means of a digital delay circuit using the clock signal CLK of the original oscillation and a 2N ($2^n$) counter.

Figure 17:
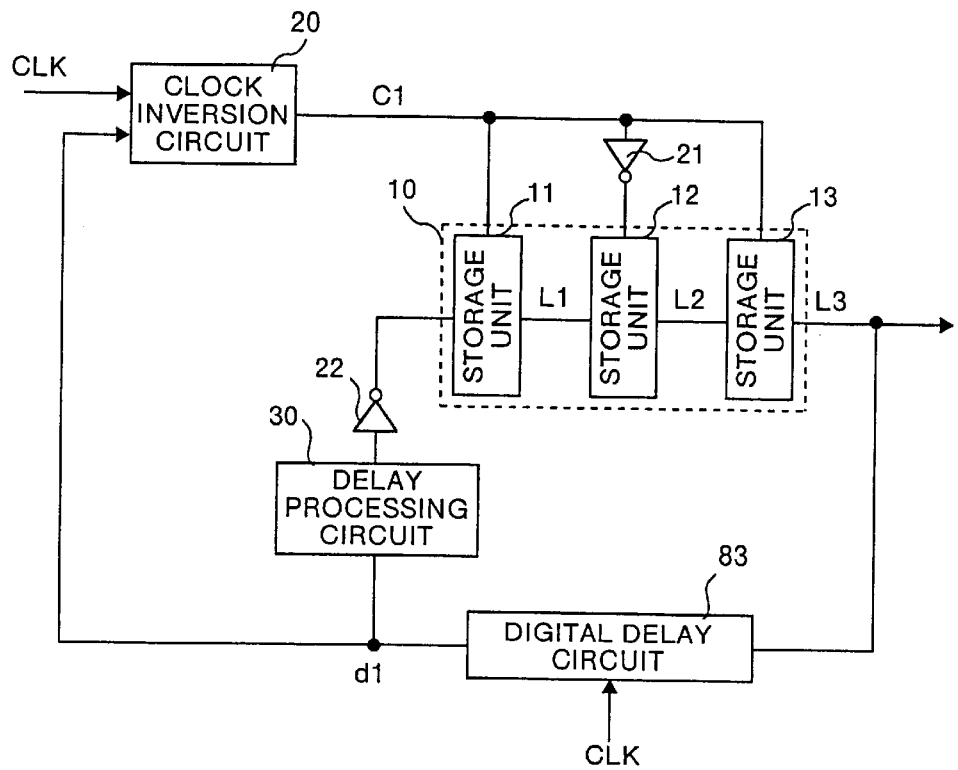
FIG. 17 is a block diagram which shows a conceptual configuration of a tenth embodiment of the frequency divider according to this invention.

As shown in FIG. 17, the digital delay circuit 83 is added to the frequency divider of the first embodiment shown in FIG. 1. The circuit configuration and operation of the storage units 11, 12 and 13, the clock inversion circuit 20, the inverters 21 and 22, and the delay processing circuit 30 are the same as those of the first embodiment.

Figure 18:
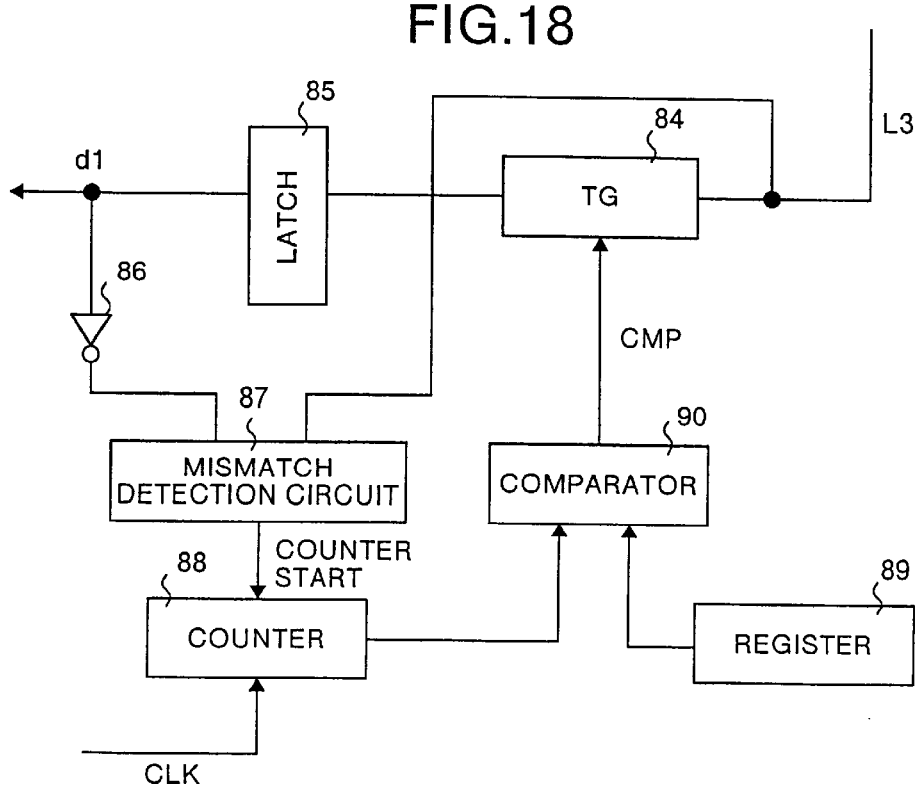
FIG. 18 is a block diagram which shows an internal configuration example of a digital delay circuit in the tenth embodiment of the frequency divider according to this invention.

FIG. 18 shows an example of an internal configuration of the digital delay circuit 83. The digital delay circuit 83 includes the transmission gate 84, latch 85, inverter 86, mismatch detection circuit 87, counter 88, register 89, and the comparator 90. The output L3 of the final storage unit 13 is input to the latch 85 via the transmission gate 84. The transmission gate 84 is opened by a CMP signal, which is output from the comparator 90 when the result of comparison is coincidence. When the output L3 of the final storage unit 13 is different from the output d1 of the latch 85, i.e., when the output L3 of the final storage unit 13 has changed, the mismatch detection circuit 87 detects this change and inputs a counter start signal to the counter 88. The counter 88 counts pulses of the clock signal CLK of the original oscillation, and inputs the count to the comparator 90. The value of the register 89 is set equal to a desired delay, i.e., the number of clocks of the clock signal CLK corresponding to the delay is set in. When providing the output L3 of the final storage unit 13 with a delay corresponding to one clock, the register value is set equal to "1". When providing the output L3 of the final storage unit with a delay corresponding to three clocks, the register value is set equal to "3". The comparator 90 compares the output of the counter 88 with the value set in the register 89. When the counter output coincides with the value set in the register 89, the comparator 90 outputs a CMP signal. When the CMP signal is input to the transmission gate 84, it is opened.

Figure 19:
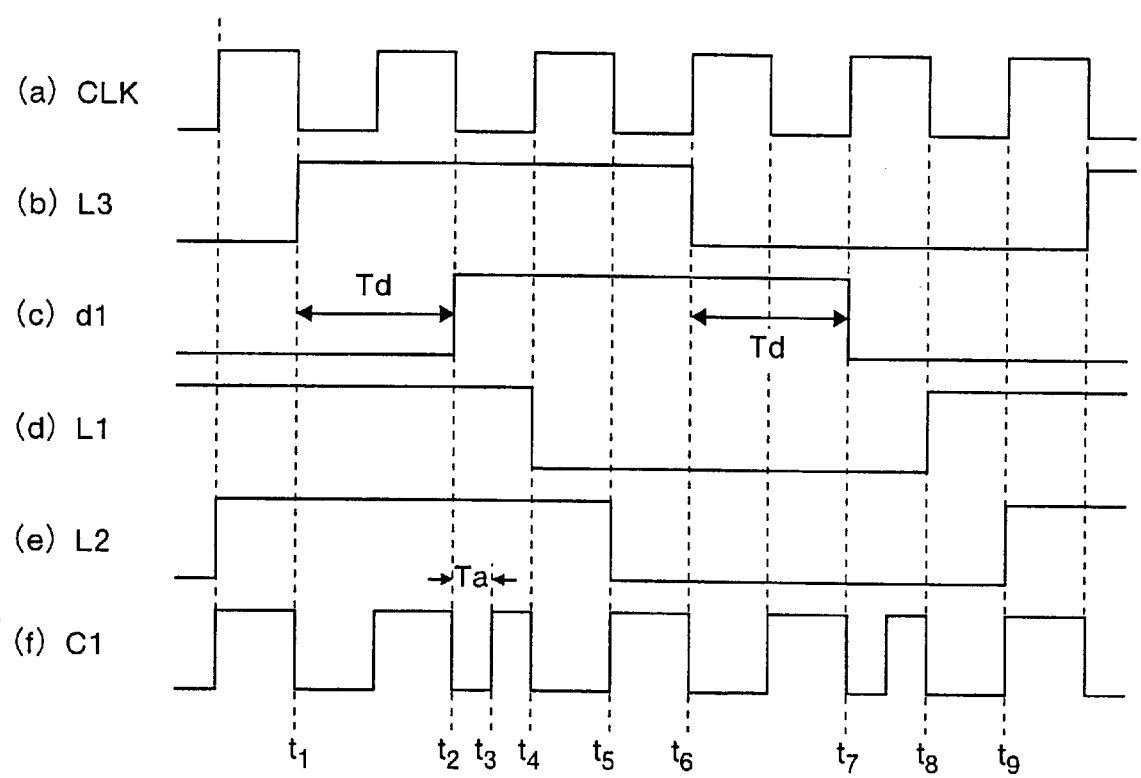
FIG. 19 is a time chart which shows an operation of the tenth embodiment.

FIG. 19 is a time chart showing operation of the frequency divider of FIG. 17. The operation will now be explained briefly. It is now assumed that the value of the register 89 is set to "1" in order to provide a delay corresponding to one period of the clock signal CLK.

At time t1, the output L3 of the final storage unit 13 rises to 1. Mismatch thus occurs between the output L3 of the final storage unit 13 and the output d1 of the latch. The mismatch detection circuit 87 detects the mismatch, and starts the counter 88. When the counter 88 has finished in counting one clock of the clock signal CLK, the counter output coincides with the output of the register 89. At this time t2, the comparator 90 outputs the CMP signal. At the time t2, therefore, the transmission gate 84 is opened. At the time t2, the output d1 of the latch 85 rises to 1. In this way, the output d1 of the latch 85 is delayed from the output L3 of the final storage unit 13 by a predetermined delay time Td (which is one clock period in this case).

As explained earlier, the input control signal C1 is inverted by the change of the output d1 of the digital delay circuit 83 at time t3 at which the time Ta has elapsed from the time t2. The delay processing circuit 30 is inserted between the digital delay circuit 83 and the first storage unit 11. Therefore, even if the output d1 of the digital delay circuit 83 changes, the output L1 of the first storage unit 11 does not change near a time region ranging from the time t1 to the time t2.

At time t4, the input control signal C1 falls to 0. As a result, the output L1 of the first storage unit 11 falls to 0. At time t5, the input control signal C1 rises to 1. As a result, the output L2 of the second storage unit 12 falls to 0.

At time t6, the output L3 of the final storage unit 13 falls to 0. Thus, mismatch occurs between the output L3 of the final storage unit 13 and the output d1 of the latch. As a result, the mismatch detection circuit 87 detects the mismatch, and starts the counter 88. As described earlier, the output d1 of the latch 85 falls to 0 at time t7 after a delay time Td corresponding to one clock period from the time t6.

As described earlier, the output L1 of the first storage unit 11 rises to 1 at time t8, and the output L2 of the second storage unit 12 rises to 1 at time t9.

In this way, a signal resulting from frequency division with a division factor of 5 conducted on the clock signal CLK can be obtained from the output L3 of the final storage unit 13. If the value of the register 89 is set equal to "2" and thereby the digital delay is set equal to two clock periods, then a signal resulting from frequency division with a division factor of 7 (=3+2×2) can be obtained. In other words, a signal resulting from frequency division with a division factor of n+2×X (where n=2 or 3) can be obtained according to the value X set in the register 89.

In the digital delay circuit shown in FIG. 18, an edge signal may be generated from the comparator 90 by omitting the transmission gate 84 and making the latch 85 the edge trigger type.

Figure 20:
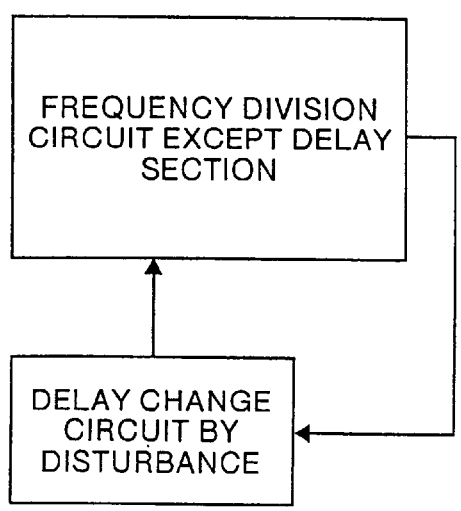
FIG. 20 is a block diagram which shows a conceptual configuration of an eleventh embodiment of the frequency divider according to this invention.

An eleventh embodiment of the present invention will now be described by referring to FIG. 20. The eleventh embodiment uses a delay change circuit including a circuit or a semiconductor element having a signal delay changed by disturbance such as a temperature change. The amount of delay is changed by an external factor, and thereby the frequency division factor is changed.

Figure 21:
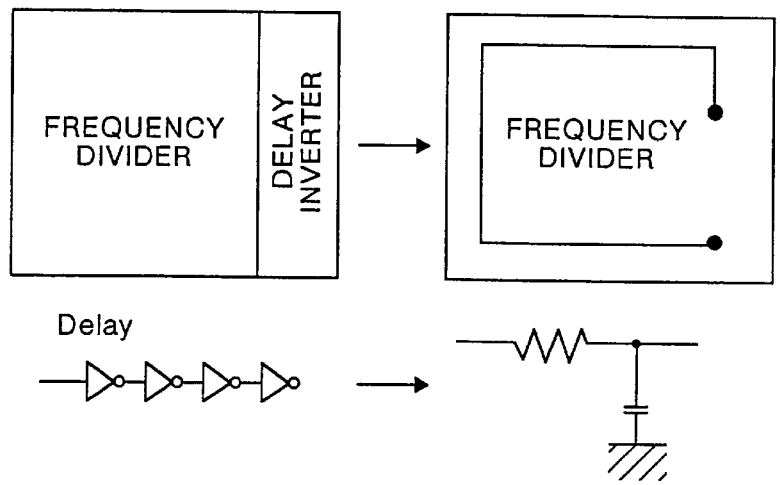
FIG. 21 is a block diagram which shows a conceptual configuration of a twelfth embodiment of the frequency divider according to this invention.

A twelfth embodiment of the present invention will now be explained by referring to FIG. 21. In the twelfth embodiment, an RC delay caused by wiring serving as an analog delay is adopted. In other words, a delay is given by resistance and capacitance of upper layer wiring of the circuit as application of frequency division of a fast clock signal. As compared with the technique of changing the delay by means of the number of connected inverters, the area of the mounted circuit can be made small.

In the foregoing embodiments, the input control signal C1 input to the respective storage units is a one-phase signal. However, two-phase signals may be used as the input control signal. In this embodiment, two-phase input control signals C1 and C2 are used.

Figure 22:
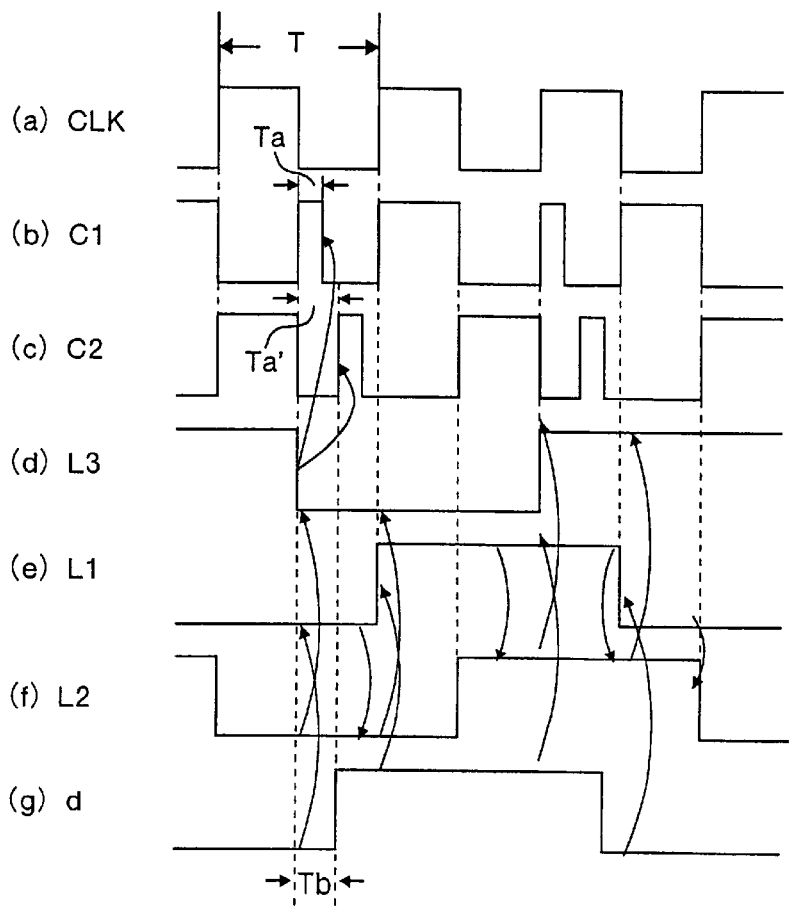
FIG. 22 is a time chart which shows an operation of a thirteenth embodiment of the frequency divider according to this invention.
Figure 23:
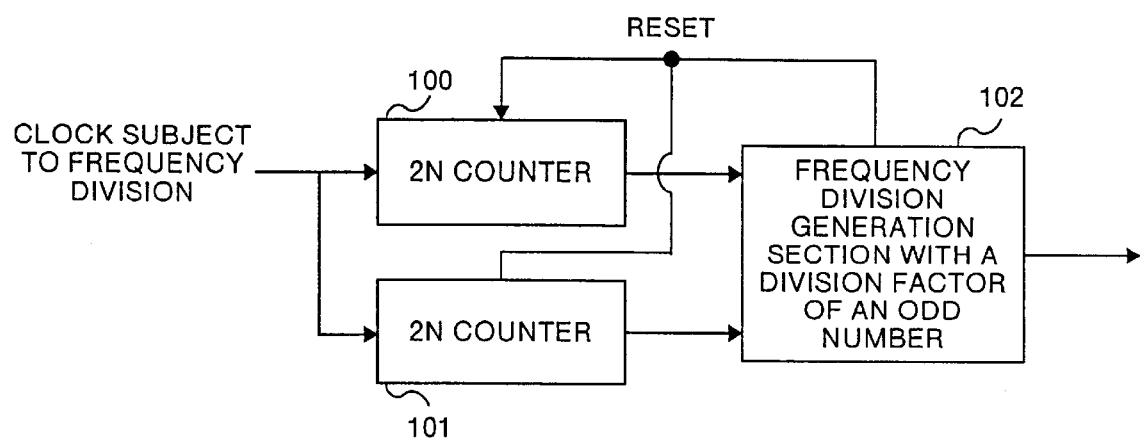
FIG. 23 is a diagram which shows the conventional art.

FIG. 22 shows a time chart when the two-phase input control signals C1 and C2 are used. As a frequency divider, a circuit having three storage units is adopted as shown in the first embodiment.

In this case, however, for example, two clock inversion circuits are provided in order to generate two-phase input control signals C1 and C2. As for one input control signal C1, the clock signal CLK of the original oscillation and the output L3 of the latch 13 at the final stage are input to a clock inversion circuit, in the same way as the first embodiment. The clock signal CLK is inverted at timing of a change of the output L3 of the latch 13 at the final stage. The signal C1 is inverted a time Ta after the change of the output L3 of the latch 13 at the final stage. The other input control signal C2 is a signal which is complementary to the input control signal C1 so that an odd-numbered storage unit and an even-numbered storage unit will not latch data simultaneously every half period of the clock. In this case, by, for example, providing a delay larger than that of the input control signal C1, the signal C1 is inverted a time Ta' (where T/2>Ta'>Ta) after the change of the output L3 of the latch 13 at the final stage. In this case, the input control signal C1 is input to the first storage unit 11 and the third storage unit 13, and the input control signal C2 is input to the second storage unit 12 without being passed through the inverter 21 (see FIG. 1). Since operation using the two-phase clocks C1 and C2 is essentially the same as the operation of the first embodiment, explanation thereof will be omitted.

Such a circuit as to input the input control signal C1 to an even-numbered stage and the input control signal C2 to an even-numbered stage may also be formed. As for the input control signals, other arbitrary input control signals may be used so long as the input control signals prevent an odd-numbered stage and an even-numbered stage from latching data simultaneously. The expression "input control signals are supplied to an odd-numbered stage and an even-numbered stage in a complementary manner" includes all of such complementary input control signals that the odd-numbered stage and the even-numbered stage do not latch data simultaneously, irrespective of the number of phases of the input control signal.

As heretofore explained, according to the frequency divider of this invention, the clock signal is inverted in logic at timing of a change of the output of the final storage unit, and the logic inverted clock signal is supplied to odd-numbered storage units and even-numbered storage units in a complementary manner as an input control signal. In addition, the output of the final storage unit is inverted in logic and is provided with a predetermined delay. The delayed output is input to a data input of a first storage unit in the storage. Thus, it is possible to implement the frequency divider which has a division factor of an odd number and a duty of 50% and can operate at high speed with a small circuit scale.

Moreover, the clock inversion circuit is formed as an exclusive-OR circuit. Therefore, inversion of the clock signal can be accomplished by using a simple configuration.

Furthermore, the gate circuit is provided. This gate circuit conducts switching as to whether the output of the final storage unit in the storage is input to the clock inversion circuit. By the switching, either frequency division with a division factor of an even number or frequency division with a division factor of an odd number can be selected. Thus, it is possible to implement not only frequency division having a division factor of an odd number but also frequency division having a division factor of an even number with a small circuit scale and the same number of storage units.

Moreover, switching is conducted as to whether the output of the final storage unit is passed through and delayed by the delay circuit. Thus, it is possible to easily obtain different frequency division factors with the same number of storage units and a small circuit scale.

Furthermore, selection from a plurality of different delays can be conducted. Thus, it is possible to easily obtain more frequency division factors with the same number of storage units and a small circuit scale.

Moreover, the storage unit selection circuit is provided. This storage unit selection circuit selects a storage unit for signal output, from among a plurality of storage units and inputs the output of the selected storage unit for signal output to the inversion-delay circuit. A frequency division factor can be selected by the selection. Thus, it is possible to obtain an arbitrary frequency division factor with a simple configuration of selecting a storage unit number.

Furthermore, the gate circuit is provided. This gate circuit conducts switching as to whether some storage unit included in the plurality storage units is always brought into a data-through state, and a frequency division factor can be altered by the switching. Thus, it is possible to obtain an arbitrary frequency division factor with a simple configuration of selecting a storage unit number.

Moreover, the frequency division factor can be altered by conducting switching as to whether a part of the storage units is bypassed. Thus, it is possible to obtain an arbitrary frequency division factor with a simple circuit configuration.

Furthermore, the output of the final storage unit is provided with a digital delay amount corresponding to n periods of the clock signal. The frequency division factor can be altered by changing the digital delay amount n. Thus, by only altering the preset delay amount, an arbitrary frequency division factor can be obtained simply.

Moreover, the plurality of storage units in the storage can initially set equal to respectively different initial data. Thus, it becomes possible to alter the frequency division factor and the waveform to be output.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A frequency divider comprising:
    a plurality of serially-connected data storage units which temporarily hold data input based, on control by an input control signal, wherein data output from each storage unit is input into an immediately subsequent storage unit;
    a clock inversion circuit which is supplied with an output of a final data storage unit of said plurality of data storage units and a clock signal of original oscillation, which inverts logic of the clock signal at a change of the output of said final data storage unit to produce a logic inverted clock signal, and which supplies the logic inverted clock signal to odd-numbered data storage units and even-numbered data storage units of said plurality of data storage units in a complementary manner as the input control signal; and
    an inversion-delay circuit comprising
        a delay processing circuit which delays the output of the said final data storage unit for a predetermined time,
        a delay selection circuit for selecting one of (i) the output of said final data storage unit delayed by said delay processing circuit and (ii) the output of said final data storage unit, and
        an inverter receiving and inverting the signal selected by said delay selection circuit and inputting the signal inverted to a data input of a first data storage unit of said plurality of data storage units, wherein said inversion-delay circuit selectively outputs the clock signal (i) by N and (ii) divided by N−2, where N is an odd integer and at least 3.

2. The frequency divider according to claim 1, wherein said clock inversion circuit is an exclusive-OR circuit which outputs an exclusive-OR of the output of said final data storage unit and the clock signal.

3. The frequency divider according to claim 1, wherein said delay processing circuit comprises a plurality of delay circuits which provide a plurality of different delay times, and said selection circuit selects one delay circuit from said plurality of delay circuits.

4. The frequency divider according to claim 1, wherein said plurality of data storage units are respectively set with different initial data.

5. A frequency divider comprising:
    a plurality of serially-connected data storage units which temporarily hold data input based, on control by an input control signal, wherein data output from each storage unit is input into an immediately subsequent storage unit;
    a clock inversion circuit which is supplied with an output of a final data storage unit of said plurality of data storage units and a clock signal of original oscillation, which inverts logic of the clock signal at a change of the output of said final data storage unit to produce a logic inverted clock signal, and which supplies the logic inverted clock signal to odd-numbered data storage units and even-numbered data storage units of said plurality of data storage units in a complementary manner as the input control signal;
    an inversion-delay circuit comprising an inverter which inverts logic of the output of said final data storage unit, and a delay processing circuit which delays the output of said final data storage unit for a predetermined time, wherein said inversion-delay circuit inputs the output delayed to a data input of a first data storage unit of said plurality of data storage units; and
    a gate circuit which switches whether the output of said final data storage unit is input to said clock inversion circuit, wherein either frequency division with a division factor of an even number or frequency division with a division factor of an odd number is selected by said gate circuit.

6. A frequency divider comprising:
    a plurality of serially-connected data storage units which temporarily hold data input based, on control by an input control signal, wherein data output from each storage unit is input into an immediately subsequent storage unit;
    a clock inversion circuit which is supplied with an output of a final data storage unit of said plurality of data storage units and a clock signal of original oscillation, which inverts logic of the clock signal at a change of the output of said final data storage unit to produce a logic inverted clock signal, and which supplies the logic inverted clock signal to odd-numbered data storage units and even-numbered data storage units of said plurality of data storage units in a complementary manner as the input control signal;
    an inversion-delay circuit comprising an inverter which inverts logic of the output of said final data storage unit, and a delay processing circuit which delays the output of said final data storage unit for a predetermined time, wherein said inversion-delay circuit inputs the output delayed to a data input of a first data storage unit of said plurality of data storage units; and
    a digital delay circuit which provides the output of said final data storage unit with a preset delay corresponding to n periods of the clock signal, and receives the output delayed to said clock inversion circuit, wherein a frequency division factor can be altered by changing n, and n is an integer.

7. A frequency divider comprising:
    a plurality of serially-connected data storage units which temporarily hold data input based, on control by an input control signal, wherein data output from each storage unit is input into an immediately subsequent storage unit;
    a clock inversion circuit which is supplied with an output of a final data storage unit of said plurality of data storage units and a clock signal of original oscillation, which inverts logic of the clock signal at a change of the output of said final data storage unit to produce a logic inverted clock signal, and which supplies the logic inverted clock signal to odd-numbered data storage units and even-numbered data storage units of said plurality of data storage units in a complementary manner as the input control signal;
    an inversion-delay circuit comprising an inverter which inverts logic of the output of said final data storage unit, and a delay processing circuit which delays the output of said final data storage unit for a predetermined time, wherein said inversion-delay circuit inputs the output delayed to a data input of a first data storage unit of said plurality of data storage units, wherein said plurality of data storage units are trigger level data storage units, said frequency divider further comprises switchover circuits which switch whether some data storage units included in said plurality of data storage units are always brought into a data-through state, and frequency division factor can be altered by switching of said switch-over circuits.

8. A frequency divider comprising:

a plurality of serially-connected data storage units which temporarily hold data input based, on control by an input control signal, wherein data output from each storage unit is input into an immediately subsequent storage unit;

a clock inversion circuit which is supplied with an output of a final data storage unit of said plurality of data storage units and a clock signal of original oscillation, which inverts logic of the clock signal at a change of the output of said final data storage unit to produce a logic inverted clock signal, and which supplies the logic inverted clock signal to odd-numbered data storage units and even-numbered data storage units of said plurality of data storage units in a complementary manner as the input control signal;

an inversion-delay circuit comprising an inverter which inverts logic of the output of said final data storage unit, and a delay processing circuit which delays the output of said final data storage unit for a predetermined time, wherein said inversion-delay circuit inputs the output delayed to a data input of a first data storage unit of said plurality of data storage units, wherein said plurality of data storage units are edge trigger data storage units, said frequency divider further comprises switchover circuits among said plurality of data storage units, each of said switchover circuits switching between an output of an immediately preceding data storage unit and an output of a third data storage unit upstream from said switchover circuit, and frequency division factor can be altered by switching of said switch-over circuits.

* * * * *